United States Patent
Hirao et al.

(10) Patent No.: US 9,654,027 B2
(45) Date of Patent: May 16, 2017

(54) SEMICONDUCTOR DEVICE AND POWER CONVERTER USING THE SAME

(71) Applicant: Hitachi, Ltd., Tokyo (JP)

(72) Inventors: Takashi Hirao, Tokyo (JP); Mutsuhiro Mori, Tokyo (JP)

(73) Assignee: Hitachi, Ltd., Tokyo (JP)

(*) Notice: Subject to any disclaimer, the term of this patent is extended or adjusted under 35 U.S.C. 154(b) by 55 days.

(21) Appl. No.: 14/719,413

(22) Filed: May 22, 2015

(65) Prior Publication Data
US 2015/0340965 A1 Nov. 26, 2015

(30) Foreign Application Priority Data

May 23, 2014 (JP) .................................. 2014-106643

(51) Int. Cl.
*H02M 7/537* (2006.01)
*H01L 27/06* (2006.01)
(Continued)

(52) U.S. Cl.
CPC ........ *H02M 7/537* (2013.01); *H01L 27/0629* (2013.01); *H01L 27/0727* (2013.01);
(Continued)

(58) Field of Classification Search
CPC . H01L 29/00; H01L 29/0696; H01L 29/7391; H01L 29/7392; H01L 29/80; H01L 29/8083; H01L 27/00; H01L 21/0245; H01L 21/02458; H01L 33/007; H02M 7/537
(Continued)

(56) References Cited

U.S. PATENT DOCUMENTS

| 7,880,174 B2* | 2/2011 | Shimizu | H01L 25/18 257/449 |
| 2004/0212011 A1* | 10/2004 | Ryu | H01L 29/872 257/335 |

(Continued)

FOREIGN PATENT DOCUMENTS

| JP | 11-510000 A | 8/1999 |
| JP | 2006-524432 A | 10/2006 |

(Continued)

OTHER PUBLICATIONS

Extended European Search Report received in corresponding European Application No. 15168308.3 dated Oct. 1, 2015.

*Primary Examiner* — Yemane Mehari
(74) *Attorney, Agent, or Firm* — Mattingly & Malur, PC

(57) ABSTRACT

A semiconductor device is provided that can prevent a current from being concentrated into a specific chip, and can reduce loss as well as noise. The semiconductor device according to the present invention includes: a switching element; a main diode that is connected in parallel to the switching element; and an auxiliary diode that is connected in parallel to the switching element and has a different structure from that of the main diode, wherein in a conductive state a current flowing through the auxiliary diode is smaller than that through the main diode, and in a transition period from the conductive state to a non-conductive state a current flowing through the auxiliary diode is larger than that through the main diode.

11 Claims, 10 Drawing Sheets

(51) Int. Cl.
  *H03K 17/16* (2006.01)
  *H03K 17/74* (2006.01)
  *H01L 29/861* (2006.01)
  *H01L 29/06* (2006.01)
  *H01L 29/739* (2006.01)
  *H01L 29/08* (2006.01)
  *H01L 27/07* (2006.01)
  *H02M 7/00* (2006.01)

(52) U.S. Cl.
  CPC ...... *H01L 29/0619* (2013.01); *H01L 29/0623* (2013.01); *H01L 29/0834* (2013.01); *H01L 29/7397* (2013.01); *H01L 29/8611* (2013.01); *H03K 17/16* (2013.01); *H03K 17/74* (2013.01); *H02M 7/003* (2013.01)

(58) Field of Classification Search
  USPC .... 257/76, 77, 136–174, 279–458, 471–479; 363/131, 132
  See application file for complete search history.

(56) References Cited

U.S. PATENT DOCUMENTS

2013/0002336 A1   1/2013  Hatsukawa
2013/0021831 A1*  1/2013  Kitabatake .......... H02M 7/5387
                                            363/131

FOREIGN PATENT DOCUMENTS

| JP | 2008-17237 A | 1/2008 |
|---|---|---|
| JP | 2009-32769 A | 2/2009 |
| JP | 2009-159184 A | 7/2009 |
| JP | 2010-200585 A | 9/2010 |
| JP | 2011-004243 A | 1/2011 |
| JP | 4980126 B2 | 4/2012 |

* cited by examiner

SEMICONDUCTOR DEVICE AND POWER CONVERTER USING THE SAME

TECHNICAL FIELD

The present invention relates to a semiconductor device and a power converter using the same, more particularly to a semiconductor device that includes at least one switching element and diode elements which are connected in parallel to the switching element, and a power converter using the same.

BACKGROUND ART

Conventionally, as a technique for reducing noise that occurs if a recovery current is reduced, there has been a technique of constituting a semiconductor device by connecting in parallel a Schottky barrier diode and a silicon PiN diode, which are based on semiconductor material having a wide band gap, to reduce the noise (refer to Japanese Patent No. 4980126, for example).

A power semiconductor module is used in a wide range of fields as an element to constitute an inverter. Especially, a power semiconductor module, using a silicon IGBT (Insulated Gate Bipolar Transistor) chip for a switching device and a silicon PiN diode chip for a diode element, is superior in terms of a high breakdown voltage and low-loss properties, and thus is used in a wide range of fields such as railroads and household electrical appliances. Additionally, in recent years, there are some cases to use for a diode device a Schottky barrier diode (hereinafter, referred to as SBD), an MPS (Merged PiN Schottky), a PiN diode, or the like, which is based on semiconductor material having a wide band gap, such as silicon carbide (SiC), (hereinafter, these diodes are simply referred to as SiC diodes), in order to reduce loss. However, when these diodes are used to reduce a recovery current, noise may be generated due to resonance between a capacitance and inductance components within a subject circuit. As a countermeasure against this noise, Japanese Patent No. 4980126 discloses a technique for implementing a semiconductor device in which an SBD based on semiconductor material having a wide band gap and a silicon PiN diode are connected in parallel to reduce the noise.

The present inventors have made studies on further noise reduction in the semiconductor device including an SiC diode and a silicon PiN diode connected in parallel, to find a problem as described below.

In a conventional configuration, it is contemplated that a forward voltage across the silicon PiN diode chip is lower than that across the SiC diode chip, especially at a high temperature (e.g., a junction temperature of 150° C.), and this causes a current to concentrate into the silicon PiN diode chip to reduce the amount of power cycle resistance. In addition, if a silicon PiN diode having a high forward voltage is used to avoid the current from mainly flowing to the silicon PiN diode, a current flowing through the silicon PiN diode chip is reduced in a conductive state to cause a recovery current to be reduced, to lose effects of a noise reduction.

The studies made by the present inventors have revealed a calculation result that, in the conventional configuration, a current flowing through the silicon PiN diode chip is 1.7 times that through the SiC diode chip under the condition of the junction temperature of 150° C.

Hence, the present invention is intended to provide a technique that allows for loss reduction and noise reduction while preventing a current from concentrating into a specific chip.

SUMMARY OF THE INVENTION

In order to solve the problem described above, a semiconductor device according to an aspect of the present invention includes, for example: a switching element; a first diode element that is connected in parallel to the switching element; and a second diode element that is connected in parallel to the switching device and has a different structure from that of the first diode element, wherein in a conductive state a current flowing through the second diode element is smaller than that through the first diode device, and during transition period from the conductive state to a non-conductive state a current flowing through the second diode is larger than that through the first diode device.

Alternatively, a semiconductor device according to another aspect of the present invention includes, for example: a switching element; a first diode element that is connected in parallel to the switching element; and a second diode element that is connected in parallel to the switching device and has a different structure from that of the first diode element, wherein the second diode element includes: a first semiconductor region of first conductivity type; a second semiconductor region of second conductivity type that is formed in the first semiconductor region, and a third semiconductor region of second conductivity type that is formed in the first semiconductor region and has a higher impurity concentration than that of the second semiconductor region, the second semiconductor region is connected electrically with a main electrode, and the third semiconductor region is connected electrically with the main electrode so as to have a higher resistance than a resistance according to the electrical connection between the second semiconductor region and the main electrode.

In addition, a power converter according to still another aspect of the present invention includes, for example: a pair of DC terminals; AC terminals whose number is equal to the number of phases of an alternating current; a plurality of semiconductor switching elements connected between the DC terminals and the AC terminals; and a plurality of diode elements connected in parallel to the plurality of semiconductor switching elements, wherein a semiconductor device in combination of the switching element and the diode element is the semiconductor device according to the present invention.

The objectives and novel features of the present invention as described above, as well as others, will be apparent from the description of the present specification and accompanying drawings.

According to the present invention, a semiconductor device and a power converter using the same can be implemented that allow for both loss reduction and noise reduction while preventing a current from concentrating into a specific chip.

EMBODIMENTS OF THE INVENTION

Figure 1:
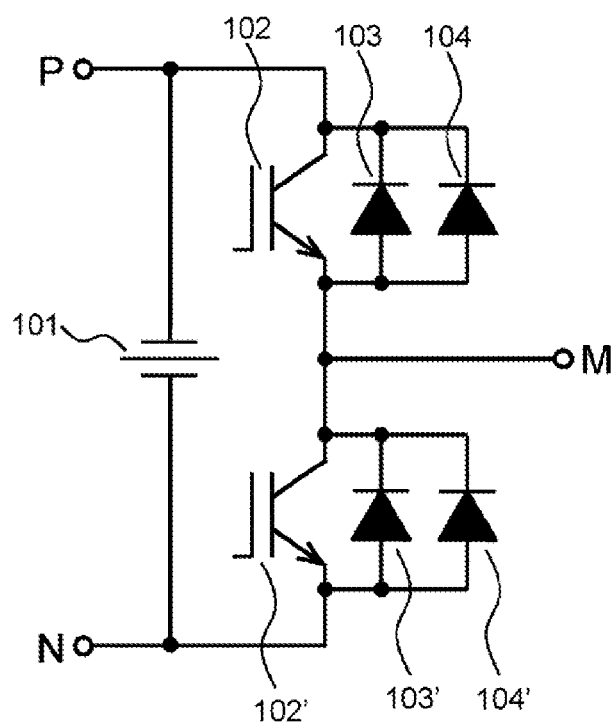
FIG. 1 is a circuit diagram of a semiconductor device according to a first embodiment of the present invention.

As described above, a semiconductor device according to the present invention includes, for example: a switching element; a first diode element connected in parallel to the switching element; and a second diode element that is connected in parallel to the switching element and has a different structure from that of the first diode element, wherein in a conductive state a current flowing through the second diode element is smaller than that through the first diode element, and during a transition period from a conductive state to a non-conductive state a current flowing through the second diode element is larger than that through the first diode element.

In this configuration, the semiconductor device may be configured such that semiconductor material on which the first diode element is based has a wider band gap than that on which the second diode element is based.

In addition, in the configuration as described above, the semiconductor device may be configured such that the switching element and the second diode element are formed on a common semiconductor chip. In this case, the semiconductor chip is preferably configured to include: a first semiconductor region of first conductivity type; a MOS-type gate; a second semiconductor region of first conductivity type that is in contact with the MOS-type gate; a third semiconductor region of second conductivity type that is in contact with the MOS-type gate and the second semiconductor region; and a fourth semiconductor region of second conductivity type that is formed within the first semiconductor region, wherein the third semiconductor region is connected electrically with a main electrode, and the fourth semiconductor region is preferably connected electrically with the main electrode so as to have a higher resistance than a resistance according to the electrical connection between the third semiconductor region and the main electrode.

Further, in the configuration as described above, the semiconductor device may be configured such that the switching element and the first diode element are formed on a common semiconductor chip. In this case, the semiconductor device is preferably configured such that the switching element is a MOSFET, and the first diode element is a body diode of the switching element, and the second diode element is preferably configured to include: a first semiconductor region of first conductivity type; a second semiconductor region of second conductivity type that is formed in the first semiconductor region; and a third semiconductor region of second conductivity type that is formed within the first semiconductor region and has a higher impurity concentration than that of the second semiconductor region, wherein the second semiconductor region is connected electrically with a main electrode, and the third semiconductor region is connected electrically with the main electrode so as to have a higher resistance than a resistance according to the electrical connection between the second semiconductor region and the main electrode.

Alternatively, a semiconductor device according to the present invention includes, for example: a switching element; a first diode element that is connected in parallel to the switching device; and a second diode element that is connected in parallel to the switching device and has a different structure from that of the first diode element, wherein the second diode element includes: a first semiconductor region of first conductivity type; a second semiconductor region of second conductivity type that is formed within the first semiconductor region; and a third semiconductor region of second conductivity type that is formed within the first semiconductor region and has a higher impurity concentration than that of the second semiconductor region, wherein the second semiconductor region is connected electrically with a main electrode, and the third semiconductor region is connected electrically with the main electrode so as to have a higher resistance than a resistance according to the electrical connection between the second semiconductor region and the main electrode.

In this configuration, the second diode element may be configured such that a plurality of the third semiconductor regions are arranged between the second semiconductor regions, or that the third semiconductor region is arranged inside the first semiconductor region.

Furthermore, a power converter according to the present invention includes, for example: a pair of DC terminals; AC terminals whose number is equal to the number of phases of an alternating current; a plurality of semiconductor switching elements connected between the DC terminals and the AC terminals; and a plurality of diode elements connected in parallel to the plurality of semiconductor switching elements, wherein a semiconductor device in combination of the switching element and the diode element is the semiconductor device having any of the aforementioned configurations according to the present invention.

Hereinafter, embodiments of a semiconductor device and a power converter using the same according to the present invention will be described in detail with reference to the drawings. Note that in the embodiments, the letters $n^-$, n, and $n^+$ indicate that the conductivity type of a semiconductor layer is n-type and the concentration of an n-type impurity becomes relatively higher in this order. The letters $p^-$, p, and $p^+$ indicate that the conductivity type of a semiconductor layer is p-type and the concentration of a p-type impurity becomes relatively higher in this order.

First Embodiment

Figure 2:
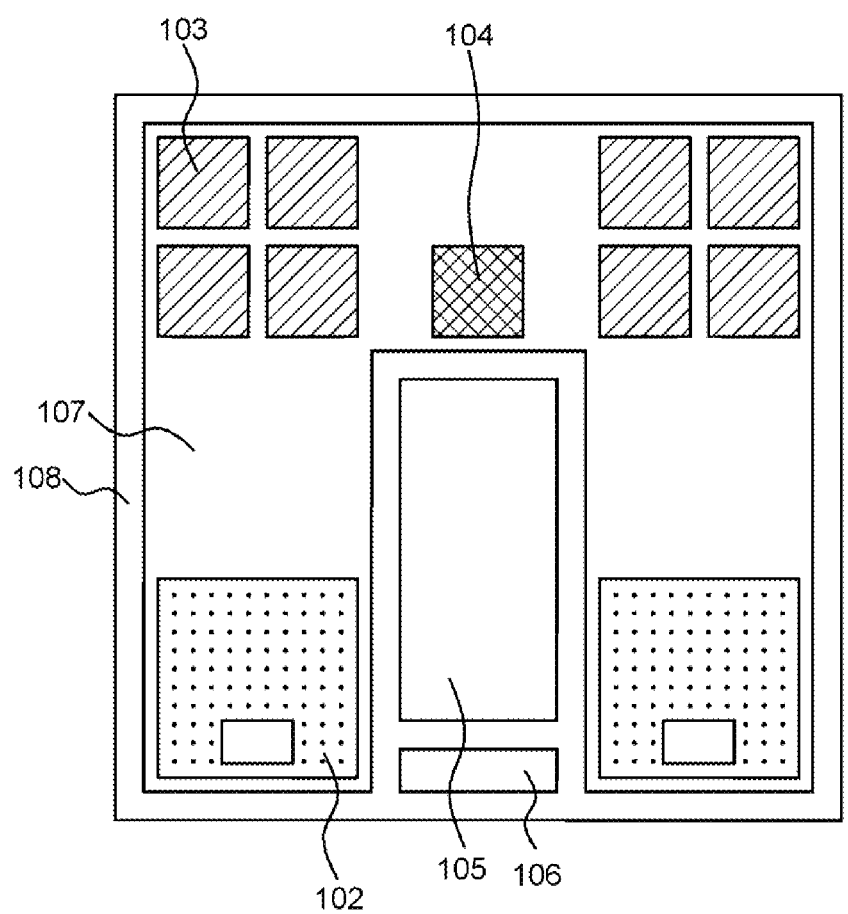
FIG. 2 is a plan view of the semiconductor device according to the first embodiment of the present invention.

FIG. 1 is a circuit diagram of a semiconductor device and a power converter using the same according to a first embodiment of the present invention, showing a main portion of the circuit diagram when a power semiconductor module is used in an inverter circuit. FIG. 2 is a configuration diagram of the power semiconductor module in part. Note that in FIG. 2, the switching element IGBT 102 corresponds to an IGBT 102 in FIG. 1. In the power semiconductor module, a main diode 103 and an auxiliary diode 104 are connected in parallel. Such components of the inverter circuit are arranged on a mounting board 108 as illustrated in FIG. 2. Note that FIG. 2 illustrates the circuit in part and does not show the entire circuit. Reference numerals in FIG. 2 are the same as those in FIG. 1. Note that reference numeral 105 denotes an emitter terminal, reference numeral 106 denotes a gate terminal, and reference numeral 107 denotes a collector terminal.

Operation of the present embodiment will be described briefly. In a three-phase inverter circuit, three pairs of two IGBTs (IGBT 102 and IGBT 102') in series connection are connected in parallel for three phases, and six IGBTs in total can be successively turned on and off to convert a direct current into a desired alternating current. Diodes (main diodes 103, 103' and auxiliary diodes 104, 104') connected in parallel to the respective IGBTs assume a role of flowing a necessary current when the IGBT is turned off. For example, when the IGBT 102 is turned off, a current which has been flowing through a load now flows through the main diode 103' and the auxiliary diode 104' that are connected in parallel to the IGBT 102'. When the IGBT 102' is turned on in this state, the current which has been flowing through the main diode 103' and the auxiliary diode 104' stops flowing, and carriers accumulated in the diodes flow as a recovery current in the opposite direction. This recovery current may cause switching loss to be increased, but also has an aspect of serving as a damper to suppress noise due to the resonance in the circuit.

Here, in the present embodiment, in a conductive state a current flowing through the auxiliary diodes 104 and 104' is smaller than that through the main diodes 103 and 103', and during a transition period from the conductive state to a non-conductive state a current flowing through the auxiliary diodes 104 and 104' (recovery current) is larger than that through the main diodes 103 and 103'. Then, a current can be prevented in a conductive state from being concentrated into the auxiliary diode 104'.

Second Embodiment

Figure 3:
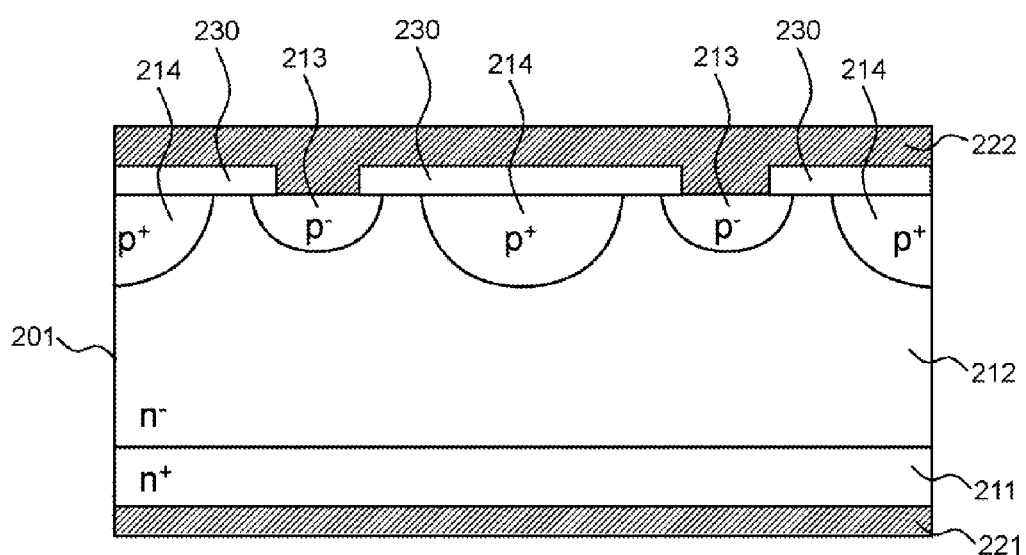
FIG. 3 is a cross-sectional view of a semiconductor device according to a second embodiment of the invention.
Figure 4A:
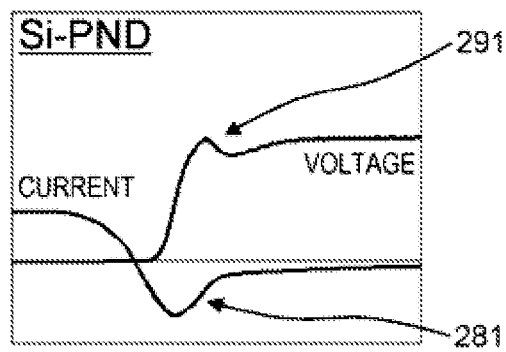
FIGS. 4A-4C shows calculation results of voltage vs. current waveforms, comparing the present invention with related arts.
Figure 4B:
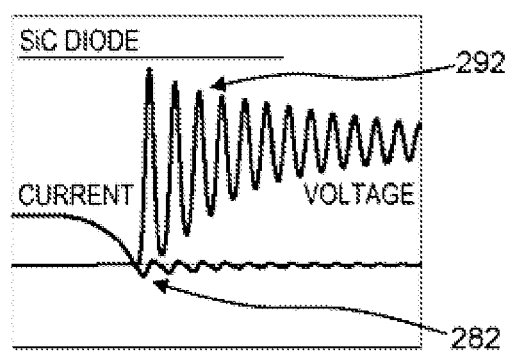
Figure 4C:
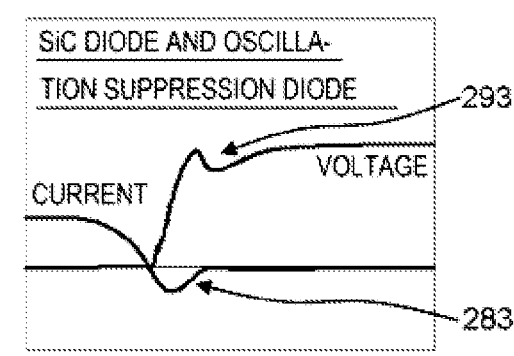

FIG. 3 is a cross-sectional view of a semiconductor device according to a second embodiment of the present invention. In addition, FIGS. 4A-4C show calculation results of operating waveforms based on the present embodiment and related arts.

In a semiconductor device 201, an n⁻ layer 212 is formed on a semiconductor substrate 211 of an n⁺ layer. The semiconductor device 201 includes two main surfaces, forming a front and rear surfaces of the device, to allow a principal current to flow through layers between a main electrode 221 (cathode electrode) arranged on one main surface and a main electrode 222 (anode electrode) arranged on the other main surface.

The semiconductor substrate 211 is in contact with the one main surface, and p⁻ layers 213 and p⁺ layers 214 are arranged on the n⁻ layer 212 facing the other main surface, wherein each p⁻ layer 213 and each p⁺ layer 214 are alternately arranged. The n⁻ layer 212 partly intervenes between each p⁻ layer 213 and each p⁺ layers 214 which are adjacent to each other.

The cathode electrode 221 and the anode electrode 222 are respectively in electrical contact with the semiconductor substrate 211 and the p⁻ layers 213. The n⁻ layer 212, each p⁺ layer 214, and a part of each p⁻ layer 213 are covered with an insulating film 230 (e.g., a silicon oxide film). Each p⁺ layer 214 is floating with respect to, or connected electrically via a high resistance to, the anode electrode 222.

Operation of the diode in the present embodiment will be described in a case where the diodes are used as the auxiliary diodes 104, 104' in FIG. 1. When the IGBT 102 is turned off to direct the current flowing through the load to flow through the main diode 103' and the auxiliary diode 104' which are connected in parallel to the IGBT 102', carriers are supplied in the auxiliary diode 104' to the n⁻ layer 212 only from the p⁻ layers 213 in contact with the anode electrode 222. For this reason, the conductivity modulation of the n⁻ layer 212 is low, and the current flowing through the auxiliary diode 104' is small. When the IGBT 102' is turned on in this state, the current flowing through the main diode 103' and the auxiliary diode 104' stops flowing, and the carriers accumulated in the diodes flow as a recovery current in the opposite direction. At this time, a potential difference between each p⁻ layer 213 and each p⁺ layer 214 is increased, to cause a depletion layer to extend in the n⁻ layer 212 from each p⁻ layer 213 toward each p⁺ layer 214. When the depletion layer reaches the p⁺ layer 214, carriers are supplied to the n⁻ layer 212 due to a potential difference between the p⁺ layer 214 and the n⁻ layer 212, to cause the conductivity modulation to be increased. Therefore, a current in a conductive state is small yet the recovery current is large to serve as a damper to suppress the noise due to the resonance in the circuit.

FIGS. 4A-4C show comparison of calculation results of operating waveforms, where FIG. 4A shows a case of using only silicon PiN diodes for diodes, FIG. 4B shows a case of using only SiC diodes for diodes, and FIG. 4C shows a case of using the diodes of the present embodiment for diodes. FIGS. 4A-4C are indicated as "Si-PiND", "SiC diode", and "SiC diode and oscillation suppression diode," respectively. In FIGS. 4A-4C, the horizontal axis represents the time, while the vertical axis represents the current or voltage. In FIG. 4A, a recovery current is large (281) even though voltage oscillation does not occur (291). In FIG. 4B, a recovery current is small (282) and voltage oscillation occurs (292). This voltage oscillation appears as noise. On the contrary, in FIG. 4C, a recovery current (283) is small yet voltage oscillation is suppressed (293). As a result, loss is reduced and also noise is reduced.

Third Embodiment

Figure 5:
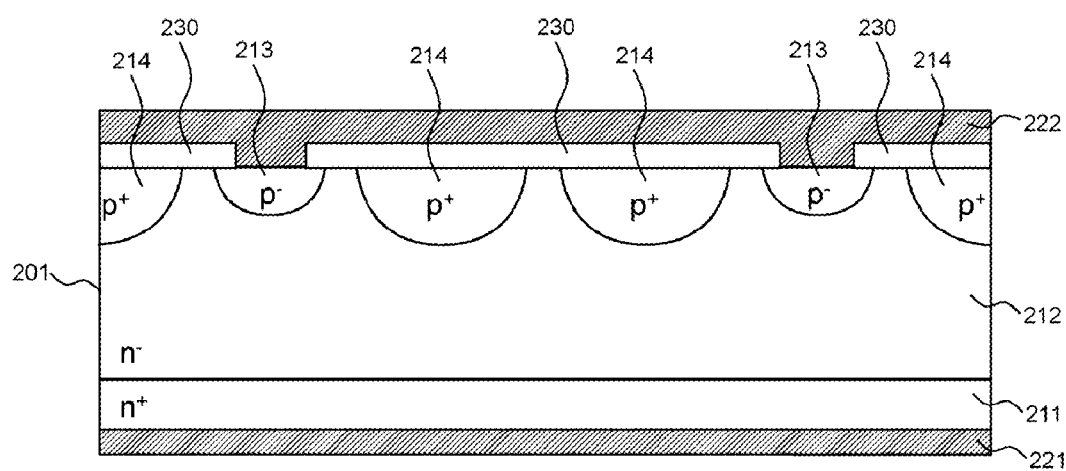
FIG. 5 is a cross-sectional view of a semiconductor device according to a third embodiment of the present invention.

FIG. 5 is a cross-sectional view of a semiconductor device according to a third embodiment of the present invention.

The present embodiment is a modification of the second embodiment. The present embodiment differs from the second embodiment on the point that a plurality of p⁺ layers 214 are arranged between every adjacent p⁻ layers 213.

According to the present embodiment, in addition to like advantageous effects as the second embodiment, electric field concentration can be relieved on the insulating film 230.

Fourth Embodiment

Figure 6:
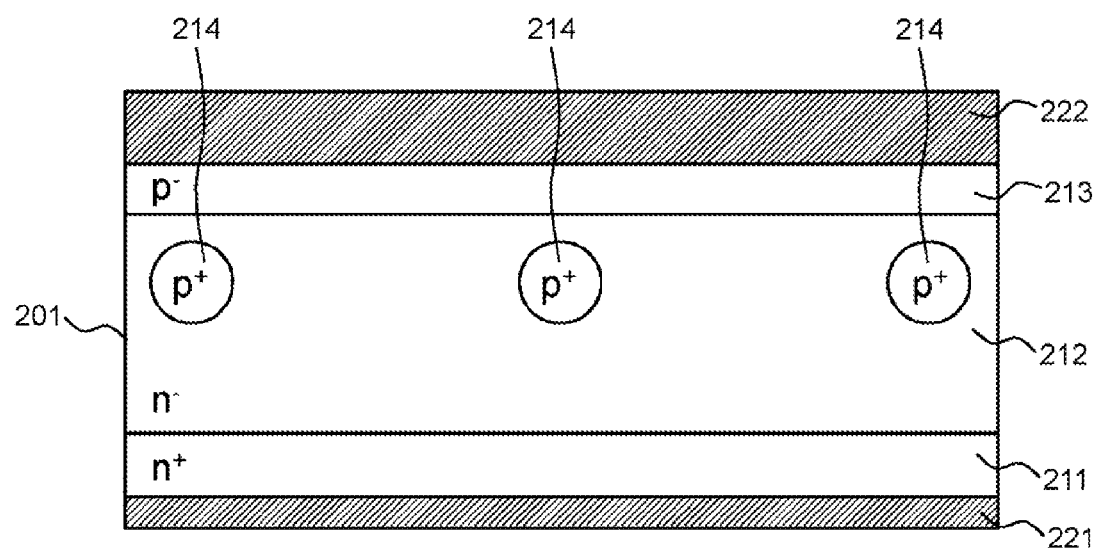
FIG. 6 is a cross-sectional view of a semiconductor device according to a fourth embodiment of the present invention.

FIG. 6 is a cross-sectional view of a semiconductor device according to a fourth embodiment of the present invention.

The present embodiment is a modification of the second embodiment. The present embodiment differs from the second embodiment on the point that each p⁺ layer 214 is arranged below the p⁻ layer 213.

According to the present embodiment, in addition to like advantageous effect as the second embodiment, a depletion layer extends in the n⁻ layer 212 between respective adjacent p+ layers 214 when a voltage is applied across the terminals of the device, to allow for reducing a leakage current.

Fifth Embodiment

Figure 7:
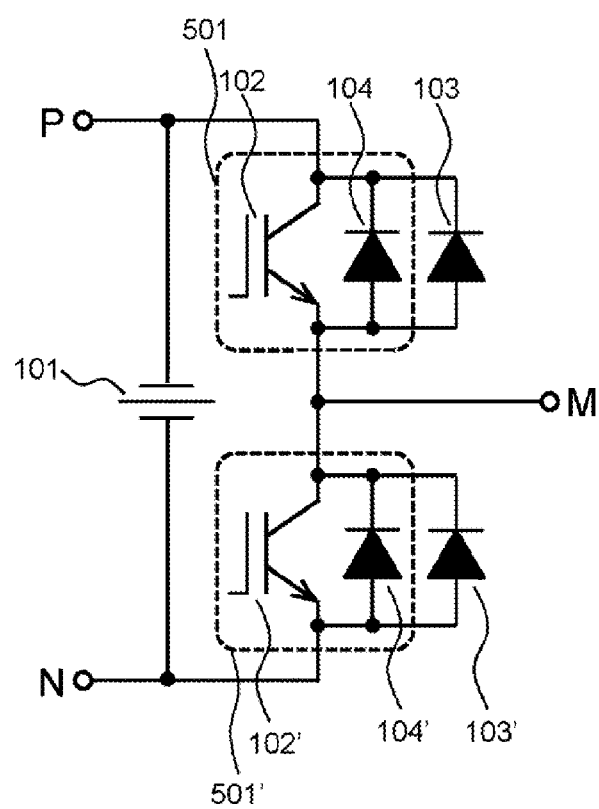
FIG. 7 is a circuit diagram of a semiconductor device according to a fifth embodiment of the present invention.
Figure 8:
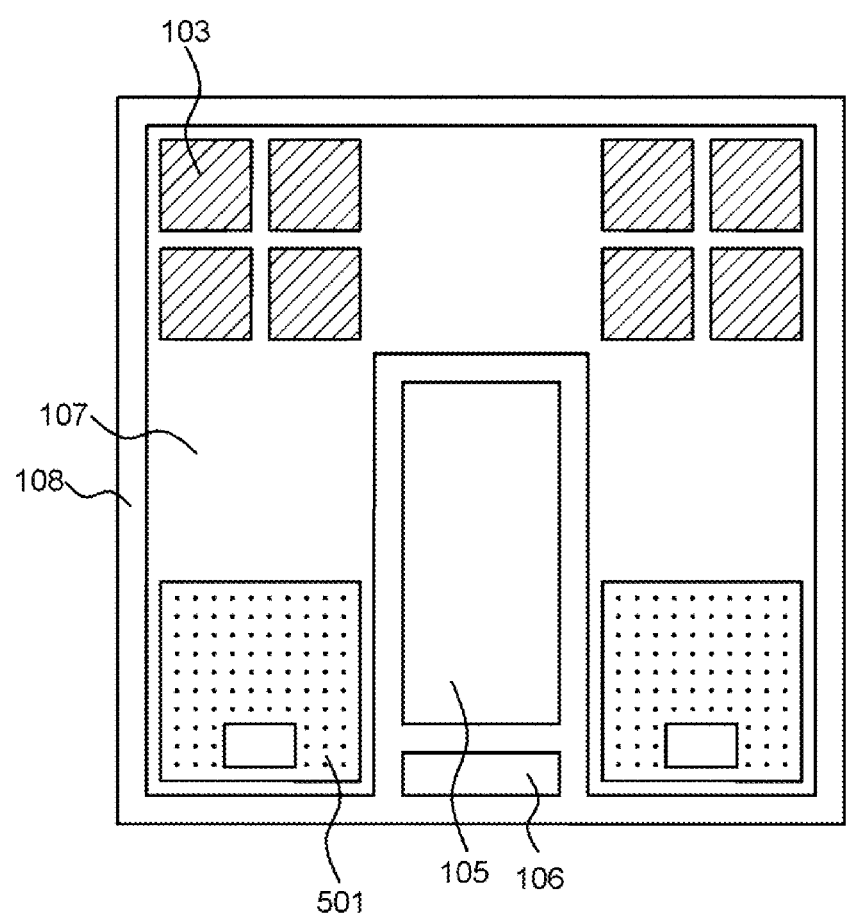
FIG. 8 is a plan view of the semiconductor device according to the fifth embodiment of the present invention.

FIG. 7 is a circuit diagram of a semiconductor device and a power converter using the same according to a fifth embodiment of the present invention, showing a main portion of the circuit diagram when a power semiconductor module is used in an inverter circuit. FIG. 8 is a configuration diagram of the power semiconductor module in part.

The present embodiment is a modification of the first embodiment. The present embodiment differs from the first embodiment on the point that the switching device IGBT 102 and the auxiliary diode 104 are arranged on a single semiconductor chip 501.

Figure 9:
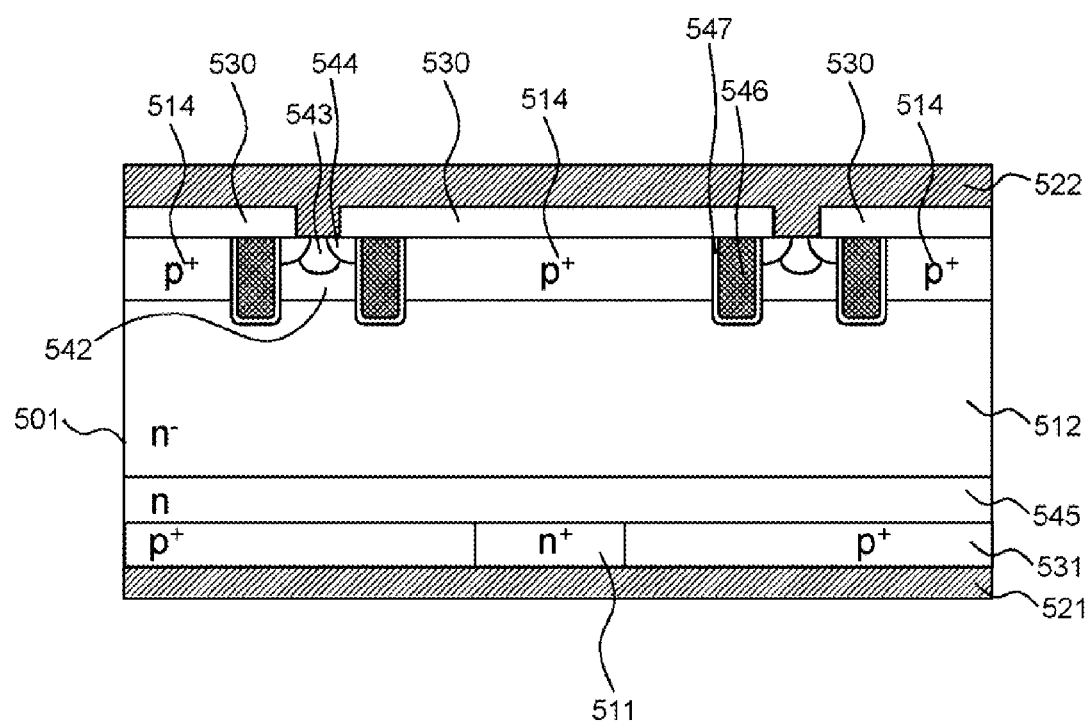
FIG. 9 is a cross-sectional view of the semiconductor device according to the fifth embodiment of the present invention.

FIG. 9 shows a cross-sectional view of the chip 501 according to the present embodiment. A collector electrode 521 of the IGBT also serves as the cathode electrode of the auxiliary diode. In addition, an emitter electrode 522 of the IGBT serves as the anode electrode of the auxiliary diode. The collector electrode 521 is in electrical contact mostly with a p+ layer 531, and partially with an n+ 511. A p+ layer 514 is floating with respect to, or connected electrically via a high resistance to, the emitter electrode 522.

Operation of the present embodiment will be described. When the IGBT 102 is turned off to direct a current flowing through the load to flow through the main diode 103', which is connected in parallel to the IGBT 102', and a semiconductor chip 501' having a function of the auxiliary diode 104', carriers are supplied in the semiconductor chip 501' to the n⁻ layer 212 from a p layer 542 which is in contact with the emitter electrode 522 via a p+ layer 543. When the IGBT 102' is turned on in this state, the current flowing through the main diode 103' and the semiconductor chip 501' stops flowing, and the carriers accumulated in the diodes flow as a recovery current in the opposite direction. At this time, a potential difference between the p layer 542 and the p+ layer 514 is increased, to cause a depletion layer to extend in an n⁻ layer 512 from the p layer 542 toward the p+ layer 514. When the depletion layer reaches the p+ layer 514, carriers are supplied to the n⁻ layer 512 due to a potential difference between the p+ layer 514 and the n⁻ layer 512, to cause conductivity modulation to be increased. Therefore, the recovery current becomes large to serve as a damper to suppress the noise due to the resonance in the circuit.

Figure 10:
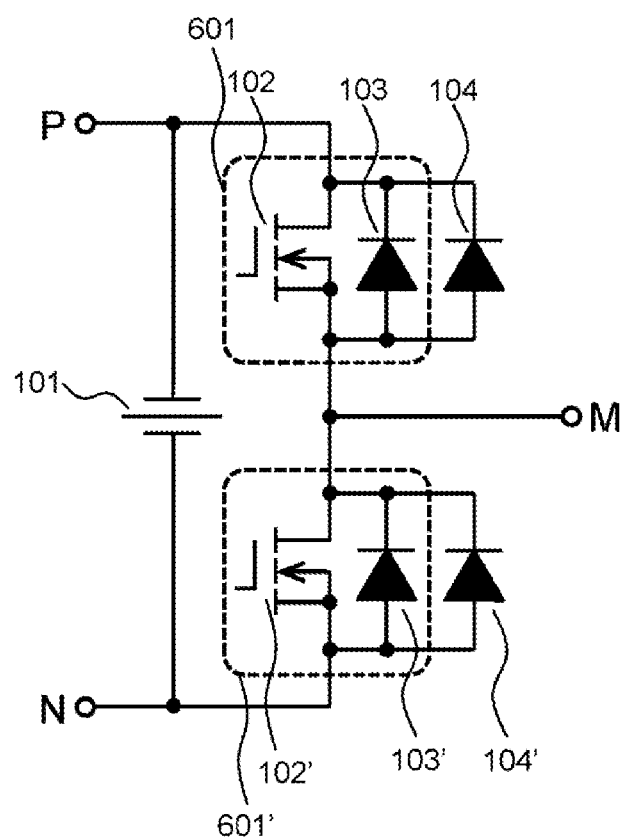
FIG. 10 is a circuit diagram of a semiconductor device according to a sixth embodiment of the present invention.
Figure 11:
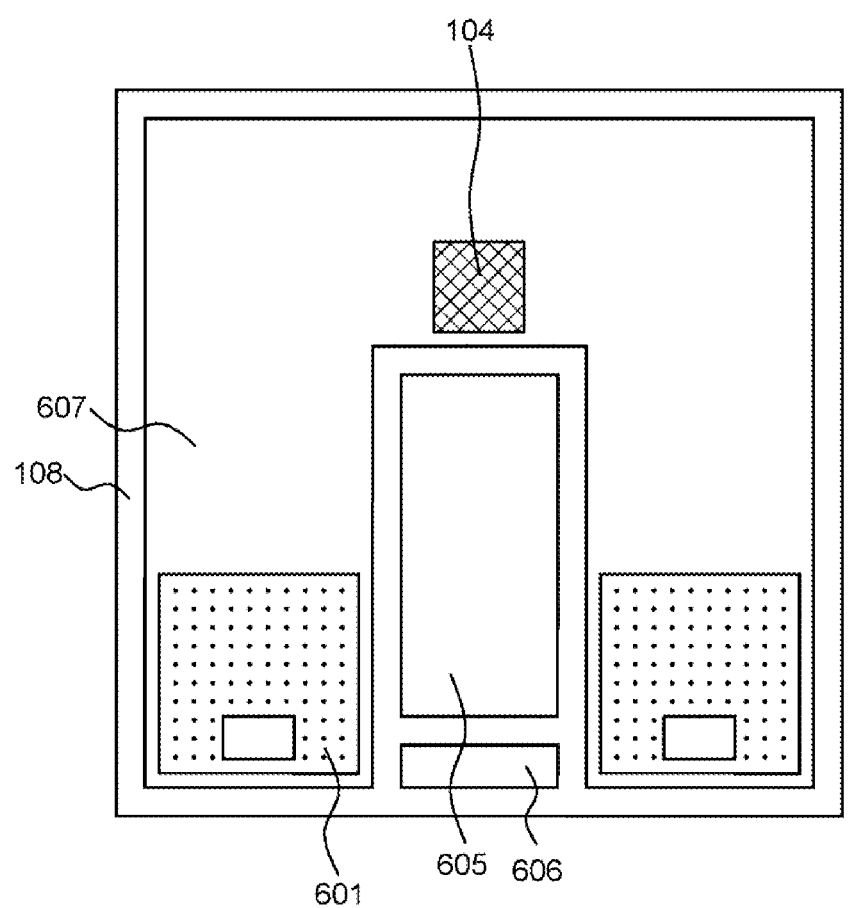
FIG. 11 is a plan view of the semiconductor device according to the sixth embodiment of the invention.

According to the present embodiment, in addition to like advantageous effects as the first embodiment, the number of chips in the power semiconductor module can be reduced Sixth Embodiment FIG. 10 is a circuit diagram of a semiconductor device and a power converter using the same according to a sixth embodiment of the present invention, showing a main portion of the circuit diagram when a power semiconductor module is used in an inverter circuit. FIG. 11 is a configuration diagram of the power semiconductor module in part.

The present embodiment is a modification of the first embodiment, and differs from the first embodiment on the point that the switching element 102 is a MOSFET, and that the main diode 103 is arranged as a body diode of the switching element 102 on a single semiconductor chip 601. Semiconductor material on which the switching element 102 is based is, for example, silicon or SiC. The structures described in the second to fourth embodiments can be applied for the auxiliary diode 104.

According to the present embodiment, in addition to like advantageous effects as the first embodiment, the number of chips in the power semiconductor module can be reduced.

Note that it is needless to say that the present invention is not limited to the embodiments as described above, and various modifications may be made within the scope of the technical ideas of the present invention. For example, in the above-mentioned embodiments, the conductivity type of each semiconductor layer may be changed to an opposite type. In addition, the semiconductor material constituting the main diode and the auxiliary diode are not limited to the combination of silicon and SiC in the embodiments as described above, and can be a combination of silicon and other wide-gap semiconductors such as GaN (gallium nitride), or even a combination of silicon and silicon. Further, the switching element can be an element other than an IGBT, e.g., a GTO (Gate Turn Off Thyristor), a MOSFET (Metal-Oxide-Semiconductor Field Effect Transistor), or a JFET (Junction Field Effect Transistor), and semiconductor material is not limited to silicon and can be other wide-gap semiconductors such as SiC and GaN (gallium nitride).

What is claimed is:

1. A semiconductor device comprising:
   a switching element;
   a first diode element that is connected in parallel to the switching element; and
   a second diode element that is connected in parallel to the switching element and has a different structure from that of the first diode device,
   wherein, in a conductive state, a current flowing through the second diode element is smaller than that through the first diode element, and, in a transition period from the conductive state to a non-conductive state, a current flowing through the second diode element is larger than that through the first diode element.

2. The semiconductor device according to claim 1, wherein semiconductor material on which the first diode element is based has a wider band gap than that of semiconductor material on which the second diode element is based.

3. The semiconductor device according to claim 1, wherein
   the switching element and the second diode element are formed on a common semiconductor chip.

4. The semiconductor device according to claim 3, wherein
   the semiconductor chip includes:
      a first semiconductor region of first conductivity type;
      a MOS-type gate;
      a second semiconductor region of first conductivity type that is in contact with the MOS-type gate;
      a third semiconductor region of second conductivity type that is in contact with the MOS-type gate and the second semiconductor region, and
      a fourth semiconductor region of second conductivity type that is formed within the first semiconductor region,
   wherein the third semiconductor region is connected electrically with a main electrode, and
   the fourth semiconductor region is connected electrically with the main electrode so as to have a higher resistance than a resistance according to an electrical connection between the third semiconductor region and the main electrode.

5. The semiconductor device according to claim 1, wherein the switching element and the first diode element are formed on a common semiconductor chip.

6. The semiconductor device according to claim 5, wherein
the switching element is a MOSFET, and
the first diode element is a body diode of the switching element.

7. The semiconductor device according to claim 5, wherein
the second diode element includes:
a first semiconductor region of first conductivity type;
a second semiconductor region of second conductivity type that is formed within the first semiconductor region; and
a third semiconductor region of second conductivity type that is formed within the first semiconductor region and has a higher impurity concentration than that of the second semiconductor region,
wherein the second semiconductor region is connected electrically with a main electrode, and
the third semiconductor region is connected electrically with the main electrode so as to have a higher resistance than a resistance according to an electrical connection between the second semiconductor region and the main electrode.

8. A semiconductor device comprising:
a switching element;
a first diode element that is connected in parallel to the switching element; and
a second diode element that is connected in parallel to the switching element and has a different structure from that of the first diode element,
wherein the second diode element includes:
a first semiconductor region of first conductivity type;
a second semiconductor region of second conductivity type that is formed within the first semiconductor region; and
a third semiconductor region of second conductivity type that is formed within the first semiconductor region and has a higher impurity concentration than that of the second semiconductor region,
wherein the second semiconductor region is connected electrically with a main electrode,
wherein the third semiconductor region is connected electrically with the main electrode so as to have a higher resistance than a resistance according to an electrical connection between the second semiconductor region and the main electrode, and
wherein, in a conductive state, a current flowing through the second diode element is smaller than that through the first diode element, and, in a transition period from the conductive state to a non-conductive state, a current flowing through the second diode element is larger than that through the first diode element.

9. The semiconductor device according to claim 8, wherein
a plurality of the third semiconductor regions are arranged between the second semiconductor regions.

10. The semiconductor device according to claim 8, wherein the third semiconductor region is arranged inside the first semiconductor region.

11. A power converter comprising:
a plurality of semiconductor devices,
where each of the semiconductor devices respectively includes:
a switching element;
a first diode element that is connected in parallel to the switching element; and
a second diode element that is connected in parallel to the switching element and has a different structure from that of the first diode device,
wherein, in a conductive state, a current flowing through the second diode element is smaller than that through the first diode element, and, in a transition period from the conductive state to a non-conductive state, a current flowing through the second diode element is larger than that through the first diode.

* * * * *